March 25, 1969 J. F. REINKE ET AL 3,435,387

SOLDERLESS MOUNTING FILTER CONNECTION

Filed Sept. 1, 1965

INVENTORS
JOHN F. REINKE
HEINZ M. SCHLICKE
FLOYD A. BLOMDAHL

BY Thomas C. Schatzel

ATTORNEY

United States Patent Office 3,435,387

Patented Mar. 25, 1969

3,435,387

SOLDERLESS MOUNTING FILTER CONNECTION

John F. Reinke, Heinz M. Schlicke, and Floyd A. Blomdahl, Milwaukee, Wis., assignors to Allen-Bradley Company, Milwaukee, Wis., a corporation of Wisconsin Filed Sept. 1, 1965, Ser. No. 484,483

Int. Cl. H01r 7/02

U.S. Cl. 333—79 6 Claims

ABSTRACT OF THE DISCLOSURE

A feed-through connector assembly having one or more filter components which surround and are axially removable, e.g., for purposes of replacement, from a feed-through conductor. The electrical connection between the filter, the conductor and a housing of the connector is provided by conductive gaskets which engage the conductor and one electrode of the filter as well as engage a second electrode of the filter and the housing.

The present invention relates to an electrical filter coupling device adapted to carry one or more electrical feed-through conductors for making junctions between current-carrying leads. The invention more particularly resides in a connector assembly having feed-through conductors surrounded by an electrical filter for bypassing high frequency currents from the conductors, and which filters are electrically connected between the conductor and the bypass path by means of electrically-conductive gaskets.

In television and other electronic circuits utilizing high frequencies, portions of the circuits radiate and thereby induce undesired high frequency currents in circuit leads intended for carrying low frequency and direct current signals. A common method for disposing of the undesired signals is to channel the leads through a shielding wall. Encircling and intermediate the leads and shield, are low reactance filters electrically connected between the leads and the shield. The filters serve as high impedance paths to the low frequency and direct current signals and low impedance paths to the high frequency signals. Thus, the desired signals pass along the leads to the external circuitry and the undesired signals are bypassed to the shield.

In filter coupling devices heretofore available, such as multiple lead connectors, filter blocks and terminal blocks, the circuit leads were connected to feed-through conductors. The conductors were soldered or welded to a surrounding filter to make electrical and mechanical connection between the conductor and the filter component. The filter components were mounted within a housing having a conductive portion with one electrode of the filter soldered or welded to the conductive portion, thereby providing a high frequency path between the conductor, the filter and the housing. One difficulty has been soldering or welding the filters to the conductor and to the housing, This generally required highly skilled techniques, especially where a large number of small filters were placed within a single housing. Another drawback, and a problem which has been considered in detail, is replacement when a filter failed. Since the filters in prior assemblies were soldered or welded in place, the entire connector assembly required replacement when a single filter failed. These problems were particularly acute in housings that contained multiple conductors and filters. If a filter failed, all leads to the connector assembly required disassembly. This consumed valuable time, especially where vital equipment was interconnected and "down" during the replacement. Replacement has also been uneconomical since the entire assembly was disposed of even though there might have been only a single defective filter.

The present invention provides a connector in which there are no solder or weld connections between the feed-through conductor and the low reactance filter component, nor between the ground electrode of the filter and the housing. Solder and weld connections are obviated through the use of electrically conductive gaskets. One embodiment of the present invention includes a metallic housing for electrical or mechanical connection to the shield. The feed-through conductors are supported within the housing by an insulating medium. Surrounding the feed-through conductor and slidable thereon is a high frequency filter component which carries electrodes on opposing surfaces. The electrodes on one surface are intended for electrical connection to the feed-through conductor, and the opposite electrode for connection to the housing. Also surrounding the feed-through conductor and electrically engaging the conductor and one electrode of the filter is a flexible, resilient, electrically conductive gasket. When the filter is in position and contacting the gasket it provides an electrical path between the feed-through conductor and the filter. Surrounding the exterior of the filter and electrically connecting the other electrode to the metallic housing is a second flexible, resilient, electrically conductive gasket which provides an electrical path between the other electrode and the housing. Thus, undesired high frequency signals pass through the first gasket, the filter component, and the second gasket to the housing. When it becomes necessary to replace a filter, the filter is slid from the conductor and replaced with a new filter. There are no solder or weld joints which need be broken or made. The new filter will make contact with the electrically conductive gaskets and commence operation when the circuitry is executed. If a filter in a multiple connector assembly, should require replacement, only that unit need be replaced without disturbing the remaining units comprising the assembly. This in turn provides a connector assembly which includes components that are facilely and economically replaced.

Accordingly, it is an object of the present invention to provide a feed-through conductor filter assembly of which one or more filter components may be facilely removed and replaced.

Another object of the present invention is to provide a filter assembly which when incorporating a multiple of filters permits the removal and replacement of a single filter without disturbing other filters or connectors within the assembly.

Another object of the present invention is to provide a filter connector assembly having a solderless connection between the filter and the bypass path.

Another object of the present invention is to provide a filter connector assembly having a solderless connection between the connector terminal and the filter.

A further object of the present invention is to provide a filter connector assembly capable of absorbing shocks and vibrations which may otherwise prove detrimental to the individual filter components.

The foregoing and other objects will appear in the description to follow. In the description, reference is made to the accompanying drawings which form a part hereof and in which there is shown by way of illustration a specific embodiment in which this invention may be practiced. This embodiment will be described in sufficient detail to enable those skilled in the art to practice this invention, but it is to be understood that other embodiments of the invention may be used and that changes may be made in the embodiment without deviation from the scope of the invention. Consequently, the following detailed description is not to be taken in a limiting sense, instead, the scope of the present invention is best defined by the appended claims.

Figure 1:
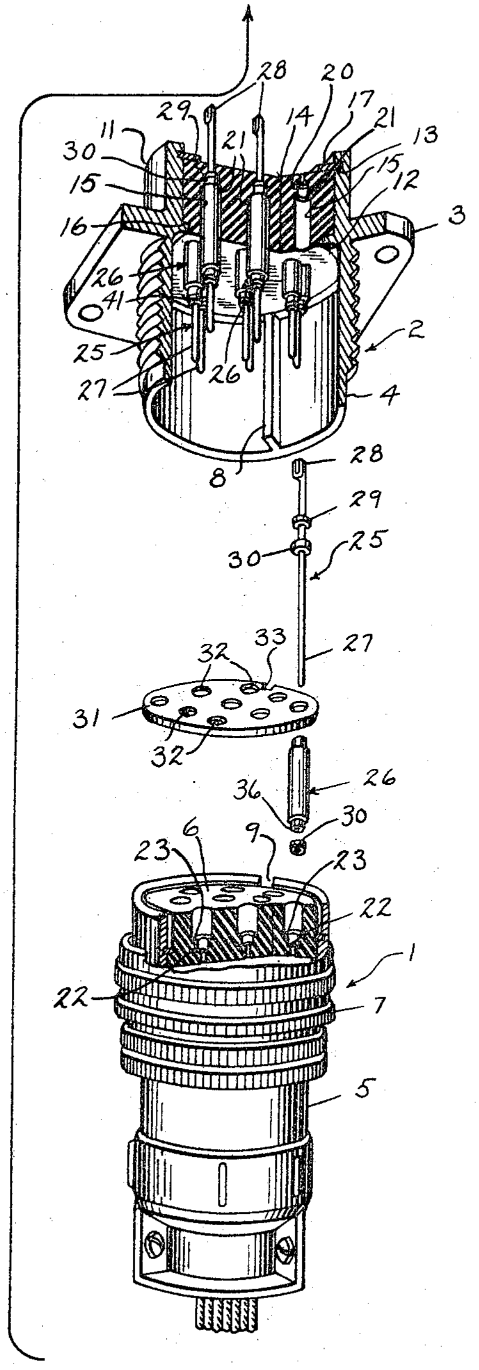
FIG. 1 illustrates in perspective with parts broken away and in section two mating members of a multi-connector coupling device incorporating the principles of the present invention. An exploded view of one filter and its supporting conductive gasket is shown to illustrate how a filter unit may be assembled or replaced.

Referring now to FIG. 1, there is shown therein a coupling device which achieves the double function of providing: (1) a detachable connection between circuit leads extending from circuitry within a chassis to external circuits, and (2) a filtering network for undesirable high frequency signals appearing on the leads. The coupling device includes a receptacle-connector housing designated by the general reference character 1, and a metallic plug-connector housing designated by the general reference character 2. The plug-connector housing 2 has a mounting flange 3 and an externally threaded thin walled skirt 4. The exteriors of the connectors 1 and 2 are of conventional design, whereb ythe mounting flange 3 of the plug-connector housing 2 may be secured to a shielding chassis (not shown) with the skirt 4 extending radially outwardly therefrom. The externally threaded cylindrical skirt 4 is thus exposed for making connection with the receptacle-connector housing 1.

The receptacle-connector housing 1, as shown in FIG. 1, presents a housing shell 5 supporting an insulating support pin socket 6 at one end. The support 6 has a multiplicity of conductor-receiving apertures. Surrounding the pin sockets 6 is a loosely fitting internally threaded coupling ring 7 adapted for engaging the threads of the skirt 4 of the housing 1 when the connection has been completed with the housing 2. The plug-connector housing 2 carries an aligning key 8 engageable with a grooved keyway 9 of the receptacle-connector housing 1. By moving the pin socket 6 into the skirt 4 with the keyway 9 coinciding with the aligning key 8 and threading the coupling ring 7 with the exterior threads on the skirt 4 the connector housings 1 and 2 will be drawn together in secure conducting relationship.

The plug-connector housing 2 has an integral, hollow cylindrical portion 11 extending axially from the opposite side of the flange 3. Intermediate the portion 11 and the skirt 4 is an internally radially extending collar 12. Also, within the cylindrical portion 11 is an internally extending lock ring slot 13 axially spaced from the collar 12. Within the housing 11 is an insulating supporting block 14 having a plurality of apertures 15 extending therethrough. The supporting block 14, which may be molded of a phenolic condensation composition, or other suitable insulating material, has a shoulder 16 adapted to engage the collar 12 when properly positioned. Engaging the exposed surface of the supporting block 14 and the slot 13 is a lock ring 17. The combination of the aligning key 8, the collar 12, the shoulder 16 and the lock ring 17 retains the supporting block 14 in fixed position.

It may be noticed that the apertures within the pin socket 6 of the receptacle-connector housing 1 and the supporting block 14 of the plug-connector housing 2 have various shoulders. The apertures 15 within the supporting block 14 each have two axially spaced shoulders 20 and 21. Likewise, the apertures within the pin socket 6 each have two axially spaced shoulders 22 and 23 which coincide in dimensions with the shoulders 20 and 21, respectively.

The apertures 15 within the supporting block 14 and the apertures within the pin socket 6 are each adapted to receive a feed-through conductor, referred to by the general reference character 25, and an associated filter element refered to by the general reference character 26. In the drawings, and for simplicity of desciption, all feed-through conductors and filter are shown to be identical in structure. To avoid overcrowding the drawings with numerals, only one feed-through conductor and filter carry numerals. In FIG. 1 a conductor 25 and filter 26 are shown in exploded view. Each conductor 25 includes a cylindrical pin 27. The pins 27 carry a partially flattened terminal end 28 to make connections with circuit leads (not shown). Intermediate the ends of each conductor is an integrally formed collar 29. The feed-through conductors 25 are each formed so that the lead 27 will protrude through an associated aperture 15 and so that the collar 29 will engage the shoulder 20 of the block 14. The engagement of the collar 29 and the shoulder 20 limits the amount of protrusion of the lead 27 through the support block 14. Surrounding each pin 27 and engaging the collar 29 is an electrically-conductive, flexible, resilient O-ring gasket 30. The O-ring gasket 30 is designed to fit snugly around its associated conductor and to engage the shoulder 29. To assure a snug fit the O-ring 30 is designed such that when in a natural unstressed position the circumference of the aperture is less than the circumference of the pin 27. Thus, when placed around the pin 27, the ring 30 will be under stress and maintain pressure against its associated pin.

There are various electrically-conductive, flexible, resilient materials available which may be utilized for the O-ring 30. A highly satisfactory material includes a silicone loaded with silver coated copper beads or silver flakes. The silicone provides a flexible, resilient material and also has a temperature coefficient suitable for operation over a wide temperature range. Various other materials have electrically-conductive powder dispersed in plastic materials and are also satisfactory to provide the flexibility and resiliency called for by this invention. Other plastic materials may include elastomers, resins, polyolefins, latex rubbers, etc. Suitable conductive gasket materials may also be of springy metal braids. The metal braids may comprise fine interwoven wires of conductive material. The tightness of the weave and the wire size determine the flexibility and resiliency of the gasket.

Surrounding each of the conductors 25 is another electrically-conductive gasket 31 having a plurality of apertures 32 to surround each feed-through conductor within the plug-connector housing 2. The circumference of the gasket 31 is adapted to rest on the collar 12 within the plug-connector housing 2 and to engage the internal surface of the thin walled skirt 4. This provides an electrical path between the gasket 31 and the shielding chassis (not shown), on which the flange 3 is mounted. In the illustrated embodiment the entire plug-connector housing 2 is shown as a metallic material. Obviously, it is not necessary that the entire housing be metallic but only that the housing have a conductive part which will provide an electrical path between the gasket 31 and the shielding chassis. The gasket 31 has a keyway slot 33 to coincide with the aligning key 8 of the connector housing 2 and the keyway 9 of the receptacle-connector housing 1. The composition of the gasket may be the same as that of the O-ring gasket 30.

Surrounding each of the conductors 25 is a standard high frequency component 26 of which the external surface makes a snug fit with the apertures 32 of the gasket 31. To assure a snug fit between the apertures 32 and the associated filters 26 the gasket 31 may be designed such that when in a normal, unstressed position the circumference of an aperture 32 is less than the circumference of its respective filter 26 at the plane of engagement of the aperture walls and the filter. Thus, when placed about the filter, the walls of the aperture 32 will be under stress and maintain pressure against the filter.

Figure 2:
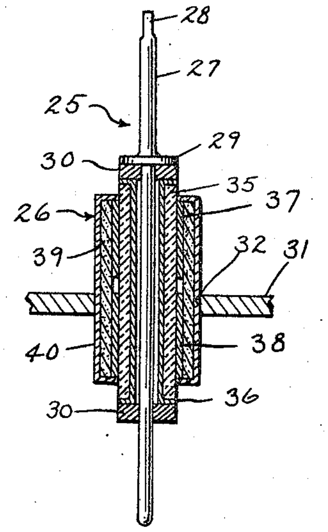
FIG. 2 illustrates in cross section an enlarged feed-through connector with an assembled filter component surrounded by an electrically conductive gasket.

FIG. 2 illustrates, in an enlarged cross sectional view, the relationship of the conductor 25, the filter 26, and the gaskets 30 and the gasket 31. Each of the filters 26 comprise a dielectric tube 35 having an internal aperture larger than the circumference of the conductor 27. Preferably, the dielectric tube 35 is of a high dielectric constant material selected from one of the titanate compositions commonly employed in capacitors adapted for high frequency application. A continuous electrode 36 extends from the opposite ends and internal wall surfaces of the tube 35. The continuous electrode 36 may be in the form of a silver paste fired in place to provide a permanent intimately bonded electrode. A pair of axially spaced electrodes 37 and 38 are disposed on the outer surface of the tube 35 and in capacitive relationship with the electrode 36. The electrodes 37 and 38 may be in the same form as the electrode 36. Surrounding the external surface of the electrodes 37 and 38 is a tubular ferrimagnetic member 39. The outer cylindrical surface of the member 39 is secured to the electrodes 37 and 38 by means of a conductive surface 40 which may also be a silver paste fired in place. The surface 40 engages the conductive gasket 31 at the walls of the associated aperture 32.

The assembly of a conductor 27 and its associated filter may be performed in the following manner: After the conductor 27 is properly positioned in the supporting block 14 the first conductive O-ring 30 is positioned over the conductor and against the collar 29. Then the filter component 26 is slid over the feed-through conductor 27 and partially through the aperture 32 until the end surface of the electrode 36 engages the O-ring 30. Next, if used, a second conductive O-ring 30 is slid over the conductor 27 to engage the electrode 36 at the opposite end. By placing the second conductive washer 30, electrical engagement between the feed-through conductor 27 and electrode 36 is further assured. Also, the second O-ring 30 tends to retain the filter component 26 in place when the receptacle-connector housing 1 and plug-connector housing 2 are disengaged.

The flexibility and resiliency of the O-ring gaskets 30 and the gasket 31 will absorb shocks and vibrations to which the assembly may be subjected. In embodiments where the filter elements are soldered or welded to the assembly the elements are also subjected to these shocks and vibrations. Frequently, especially where ceramic materials are utilized as the dielectric medium for the filter, the dielectric is fractured. Fracturing of the dielectric is substantially reduced in the present structure since the gaskets 30 and 31 absorb a large portion of these shocks and vibrations. Also, the flexibility and resiliency of the gaskets 30 and 31 permit larger tolerances in the outer dimensions of the filter components 26. This is reflected in cost savings for manufacturing the filter components 26.

Referring back to the receptacle-connector housing 1, it will be noticed that the shoulders 22 and 23 of the pin socket 6 are designed to engage the second gasket 30 and the end of the ferrimagnetic sleeve 39, respectively. Thus, when a respective filter 26 and its associated O-ring gasket 30 are in proper position, the receptacle-connector housing 1 may be aligned with the plug-connector housing 2. As the coupling ring 7 engages the skirt 4 and is tightened down the pin socket 6 exerts axial pressure on the washers 30 and the filter 26 such that good electrical contact is assured between the gaskets 30, the feed-through conductor 27 and the electrode 36. Also, the receptacle-connector housing 1 engages the top surface of the gasket 31 such that when the housing 1 and the plug-connector housing 2 are properly engaged, the conductive gasket 31 is sandwiched therebetween. This assures good contact between the gasket 31 and the collar 12 of the plug-connector housing 2. Thus, when the mounting flange 3 is mounted on a shielding chassis (not shown), the assembly provides a complete electrical path between the feed-through conductor 25 and the shielding chassis. This arrangement provides a bypass path for high frequency signals passing along the conductor 27.

At this point, it should be realized that it is not essential to the present invention that engagement of the receptacle-connector housing 1 and the plug-connector housing 2 apply axial pressure to the gaskets 30 and the component 26 to provide contact between the gaskets 30 and the filter 26. For example, though not shown in the drawings, spring clips surrounding the feed-through conductor 27 and engaging the ring washer 30 can be used. Also for a detailed discussion of the phenomena of high frequency filter components with associated ferrimagnetic material see United States Patent 3,035,237, entitled Feed-Through Capacitor granted to Heinz M. Schlicke on May 15, 1962. For a detailed discussion of a multi-terminal filter connector assembly utilizing a capacitive component with a ferrimagnetic block member see United States Patent 3,002,162, entitled Multiple Terminal Filter Connector granted to William W. Garstang on Sept. 26, 1961.

The feed-through conductor assemblies using resilient, flexible, electrically conductive gaskets to electrically interconnect feed-through conductors to filter components, and the use of electric gaskets of similar material to interconnect the filter components to the surrounding shield is a distinct departure from standard or known feed-through conductor assemblies. The present invention provides an assembly whereby a filter component need not be permanently affixed by solder or weld joints. Any one filter or filters may be assembled, removed and replaced from an associated feed-through conductor without disturbing other elements within the assembly. To illustrate this point, assume that a filter element 26 becomes defective. In such case receptacle-connector housing 1 and plug-connector housing 2 will be disengaged. The ring gasket 30 at one end of the associated defective filter 26 is removed by sliding it off the associated conductor 27. The filter component 26 is then slid off the same direction. Next a new filter component 26 is slid over the conductor 27 so that it is positioned within the associated aperture 32 of the gasket 31 and the support block 14. The previously removed washer 30 is replaced, and the receptacle-connector housing 1 and plug-connector housing 2 are engaged. The filter assembly is again ready for service. In devices heretofore available when a filter component fails it is necessary to disconnect the entire plug-connector assembly and replace it with a new assembly. Obviously this is time consuming and costly.

Figure 3:
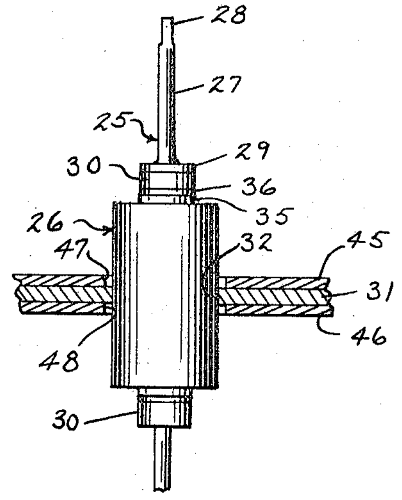
FIG. 3 illustrates a further version of an assembled filter component surrounded by an electrically conductive gasket which gasket is sandwiched between two support members.

FIG. 3 illustrates a further embodiment in which the electrically conductive gasket 31 may be incorporated. To provide the gasket 31 with additional mechanical support opposite surfaces of the gasket 31 are supported by a more rigid material 45 and 46. The materials 45 and 46 have apertures 47 and 48 extending therethrough, respectively. The apertures 47 and 48 are in axial alignment with and larger than the apertures 32 extending through the gasket 31 such that they do not interfere with the assembly of the filter component 26. Possibly there may be applications where it is desired to improve the electrical conductivity between the filter 26 and the housing of the connector assembly. In such case the support materials 45 and 46 may be comprised of an electrically conductive material such as brass, aluminum or steel.

We claim:

1. In a feed-through connector assembly, the combination comprising:
 - a housing having a conductive portion;
 - a feed through conductor positioned within the housing;
 - support means for supporting the feed-through conductor and electrically insulating the conductor from the housing;
 - an electrical filter component surrounding and axially slidable relative to the conductor for removal therefrom, said component having electrodes on opposing surfaces and in capacitive relationship;
 - a first electrically conductive gasket engaging the conductor in a snug fit and engaging one of said electrodes; and an aperture electrically conductive gasket arranged to receive the filter component, said gasket concurrently engaging in a snug fit another of said electrodes and the conductive portion of the housing.

2. In a multiconductor feed-through assembly, the combination comprising:

a housing having a conductive portion;

a plurality of feed-through conductors positioned within the housing;

insulating support for supporting the feed-through conductors in spaced fixed relationship and electrically insulated from each other and the housing;

a plurality of filter components each having electrodes on opposing surfaces in capacitive relationship, each of the components having an aperture extending therethrough and axially slidable relative to a respective feed-through conductor;

a plurality of individual electrically conductive gaskets, each gasket encircling a respective conductor and electrically engaging the associated conductor and an electrode of the respective filter; and an apertured electrically conductive gasket common to said filters and electrically engaging the conductive portion of the housing, the walls of each aperture surrounding a respective filter component and making electrical contact with another electrode of the respective filter.

3. A multiconductor feed-through assembly, in accordance with claim 2, in which the apertured electrically conductive gasket is comprised of a conductive, flexible, resilient plastic material.

4. A multiconductor feed-through assembly, in accordance with claim 2, in which, each of the individual electrically conductive gaskets are comprised of a conductive, flexible, resilient plastic material.

5. A multiconductor feed-through assembly, in accordance with claim 2, in which, each of the individual electrically conductive gaskets are comprised of a conductive, flexible, resilient plastic material, the individual gaskets being in the form of O-rings which when in a natural unstressed position have a center aperture slightly less in size than the circumference of the associated feed-through conductor; whereby the gaskets when placed about the respective conductor will be under stress and retain a snug engagement.

6. In a multiconductor feed-through assembly, the combination comprising:

a housing having a conductive portion, the housing including a plug connector and a receptacle connector, said plug connector and receptacle connector being adapted for engagement and disengagement with respect to each other;

a plurality of feed-through conductors positioned within the housing;

support means within the housing, said support means including a first insulating block within the plug connector for supporting an end of each feed-through conductor in spaced fixed relationship electrically insulated from each other and the housing, and a second insulating block within the receptacle connector for receiving the other end of the feed-through conductors in spaced apart relationship;

a plurality of filter components each having electrodes on opposing surfaces in capacitive relationship, each of the components having an aperture extending therethrough and axially slidable relative to a respective feed-through conductor;

a plurality of individual electrically conductive gaskets, comprised of a flexible, resilient plastic material, each gasket encircling a respective conductor and electrically engaging the associated conductor and an electrode on the respective filter; and an apertured electrically conductive gasket comprised of a flexible, resilient, plastic material common to said filters and electrically engaging the conductive portion of the housing, the walls of each aperture surrounding a respective filter component and making snug engagement with the respective component and electrical contact with another electrode of the respective component.

References Cited

UNITED STATES PATENTS

| | | | |
|---|---|---|---|
| 3,134,950 | 5/1964 | Cook | 333—81 |
| 3,002,162 | 9/1961 | Garstang | 333—1 |
| 2,877,433 | 3/1959 | Devot | 333—73 |
| 3,275,954 | 9/1966 | Coda et al. | 333—79 |
| 3,297,969 | 1/1967 | Kaufman | 333—79 |
| 3,200,355 | 8/1965 | Dahlen | 333—79 |

ELI LIEBERMAN, *Primary Examiner.*

C. BARAFT, *Assistant Examiner.*

U.S. Cl. X.R.

317—243; 333—81